United States Patent [19]

Nysen

[11] 4,204,260
[45] May 20, 1980

[54] RECURSIVE PERCENTILE ESTIMATOR

[75] Inventor: Paul A. Nysen, Clovelly, Australia

[73] Assignee: Unisearch Limited, Australia

[21] Appl. No.: 913,326

[22] Filed: Jun. 7, 1978

[30] Foreign Application Priority Data

Jun. 14, 1977 [AU] Australia ............................. PD0425

[51] Int. Cl.$^2$ ............................................ G06F 15/36
[52] U.S. Cl. ................................... 364/554; 307/359;
328/150
[58] Field of Search ................ 364/554; 328/145, 146,
328/150; 307/350, 354, 359

[56] References Cited

U.S. PATENT DOCUMENTS

| | | | |
|---|---|---|---|
| 3,348,031 | 10/1967 | Russell, Jr. et al. | 364/554 |
| 3,544,774 | 12/1970 | Peklenik | 364/554 |
| 4,020,286 | 4/1977 | Ceci | 364/554 X |

Primary Examiner—Jerry Smith
Attorney, Agent, or Firm—Steinberg and Blake

[57] ABSTRACT

Apparatus and method for directly measuring percentile values of a time varying analogue signal by recursively estimating a predetermined percentile level from said analogue signal. In particular, the apparatus continuously estimates the percentile sound levels from the analogue output of a sound level meter so as to monitor sound pollution levels in a particular locality during a specified time period.

6 Claims, 3 Drawing Figures

RECURSIVE PERCENTILE ESTIMATOR

BACKGROUND OF THE INVENTION

The present invention relates to apparatus employing recursive estimation for determining percentiles, being the value of an analogue signal level exceeded for a specified percentage of a period of time. In particular the invention has advantageous application in determining the sound level exceeded for a specified proportion of a predetermined period of time during which the measurement is made. This may be achieved by suitable connection of the analogue output of a sound level meter to apparatus in accordance with the invention.

It will be appreciated that the applicability of the present invention is not solely in the field of sound measurement. The apparatus of the invention may be employed in any application where a variation in a quantity requires analysis statistically to determine percentiles and where that quantity can be represented by an analogue signal. However, the invention is described in relation to the field of acoustic measurement for reasons of convenience.

Current techniques for determining percentiles from acoustic data require a determination of the sample histogram of the acoustic data. Thereafter, a cumulative distribution function is produced by statistical methods so that percentiles may then be calculated by interpolation. It will be appreciated that current techniques require time and effort to arrive at the appropriate percentiles which constitute the figures used by relevant authorities such as council and government bodies as a direct measurement of the level of a noise pollution problem at a particular location. Accordingly, it is most desirable that, for the purpose of assessing local noise pollution problems, there be a device for measuring the relevant noise statistics.

SUMMARY OF THE INVENTION

The apparatus of the invention is of substantial benefit to those concerned with measuring the noise problem in modern societies, since such apparatus is able to provide a direct and continuous reading of percentiles thereby providing an immediate reading of the magnitude of the noise pollution problem in a given area during a specified time period.

In accordance with the present invention, a recursive percentile estimator comprises a comparator for comparing a time varying signal quantity and a time varying estimate signal corresponding to a predetermined percentile. The output of the comparator provides on input to an integrator. A signal corresponding to a cumulative probability, equivalent to the predetermined percentile, provides a second input to the integrator. The output of the integrator is the time varying estimate signal.

BRIEF DESCRIPTION OF THE DRAWINGS

For a fuller understanding of the invention, reference is had to the following description, taken in connection with the accompanying drawings, in which.

DESCRIPTION OF THE PREFERRED EMBODIMENTS

Figure 1:
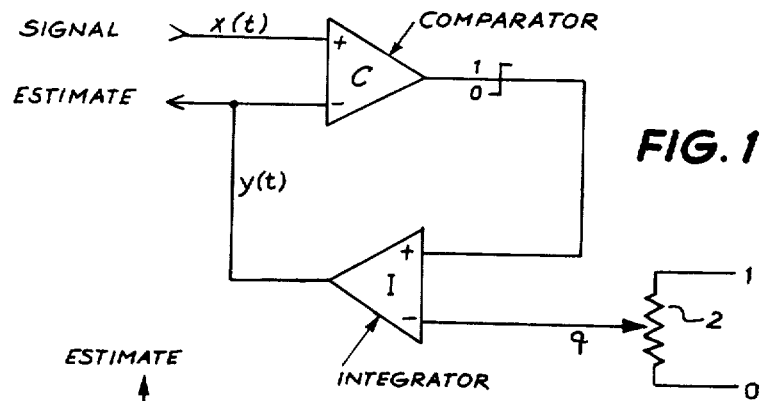
FIG. 1 is a schematic block representation of analogue apparatus in accordance with the present invention.

In the schematic arrangement of FIG. 1, the level of analogue signal x(t) is proportional to a continuously varying quantity being measured, such as the sound level detected by a dB meter. The signal x is compared with an initial estimate signal y in comparator C, which provides an output $+1$ if $x>y$ and an output 0 if $x<y$. The mean value of the output of the comparator C corresponds to the cumulative probability ($q_e$) of the signal level x(t) exceeding the estimate level y(t). The appropriate probability fraction ($0<q<1$) which corresponds to the desired percentile is set by the potentiometer 2.

If $q_e=q$, the error signal fed to the integrator I will be zero, so that the output of the integrator will be constant and will equal the signal level corresponding to the cumulative probability q. If $q\neq q_e$ then the error signal will appropriately increase or decrease the output of the integrator until $q=q_e$. It will be apparent that the settling time for this system is dependent upon the time constant of the integrator I.

The percentile (Lq) is provided by the "estimate", which can be fed directly to, for example, the same sound level meter as is measuring the varying sound, to provide the sound level of the percentile of interest.

The recursive estimation process operates by taking whatever level (estimate) is in the data register and comparing it with the instantanious signal level. If the signal level is greater than the estimate, the estimate is then increased by an amount proportional to 'q', and if it is less than the estimate, it is decreased by an amount proportional to '1-q'. This process occurs continuously, so that it ultimately establishes an equilibrium value which deviates about the actual percentile. Thus, changes in the percentile, due to a non-stationary statistic, can be tracked by such an estimator. In FIG. 1, the signal is fed to the positive input of the analogue comparator C, and the percentile estimate, which is the output of the integrator I, is fed to the negative input of the comparator. The output of the comparator C is fed to the non-inverting input of the integrator I. A voltage analogue q of the required cumulative probability is fed to the inverting input of the invention. When the "estimate" is equal to the actual percentile, the error signal to the integrator I will average zero and, consequently, the estimated value will remain constant. If the signal's percentile level changes, a corresponding error signal will be fed to the integrator and the "estimate" will be gradually updated.

Figure 2:
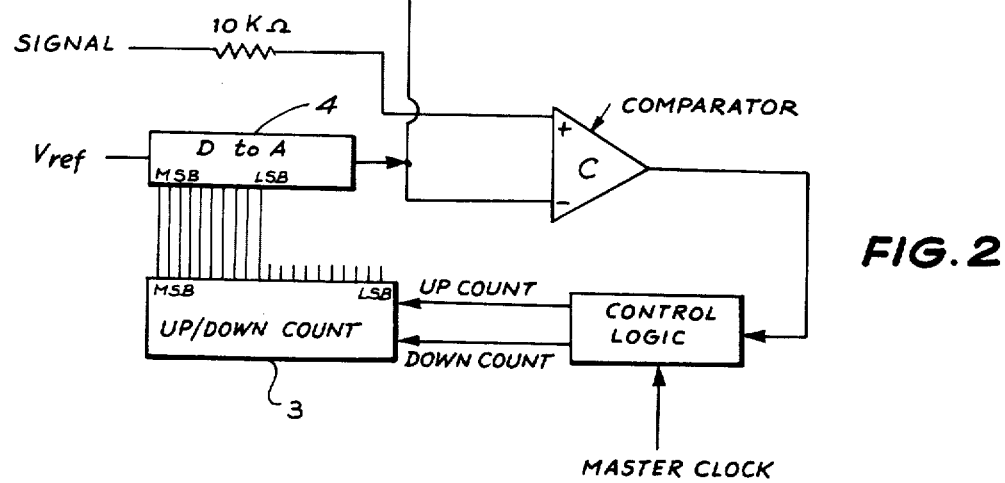
FIG. 2 is a block diagram of an embodiment of a digital recursive percentile estimator of the invention.

FIG. 2 shows a digital recursive percentile estimator wherein the integrator comprises an up/down reversible digital counter 3 driving a digital to analogue converter 4. The structure of this digital arrangement enables much longer time constants than are possible with an analogue integrator. The time constant in such an arrangement, determined by the controllable master clock.

As shown in FIG. 2, the linear recursive percentile estimator (line RPE) consists of the 20 bit up/down binary counter 3. The ten most significant bits are fed to the inexpensive digital to analogue (D-A) converter 4. The voltage output of the converter 4 is fed to the inverting input of the analogue comparator C The signal of interest is fed to the non-inverting input of the comparator. The logical output of the comparator determines the direction in which the counter 3 should count. That is, when the output of the comparator is in the high state, the counter counts up or forward. When in the low state, the counter 3 counts down or backward. The desired cumulative probability (q) can be set by a mark to space generator forming a part of the control logic circuit 5. The rate of upward, or forward, and downward or backward, counting is determined by the cumulative probability (q) selected. The upward count rate equals the master clock rate times $(1-q)$. The downward count rate equals the master clock rate times (q). Consequently, when a correct estimate is achieved, the comparator will spend the proportion of time (q) in the high state and the proportion $(1-q)$ in the low state. The upward count rate will thus equal $q(1-q)$ times the master clock rate and the downward count rate will equal $(1-q)q$ times the master clock rate. Therefore, the counter 3 will simply oscillate around the correct estimate which corresponds to the required percentile.

The output of the line RPE, in the embodiment of FIG. 2, is displayed in octal format and also provides an analogue output. This presentation is due to the nature of the D-A converter and its associated reversible counters. A decimal-based version of the device may be made by directly replacing the binary reversible counters with their binary coded decimal (BCD) equivalents. The D-A converter would also be replaced by its BCD equivalent.

Figure 3:
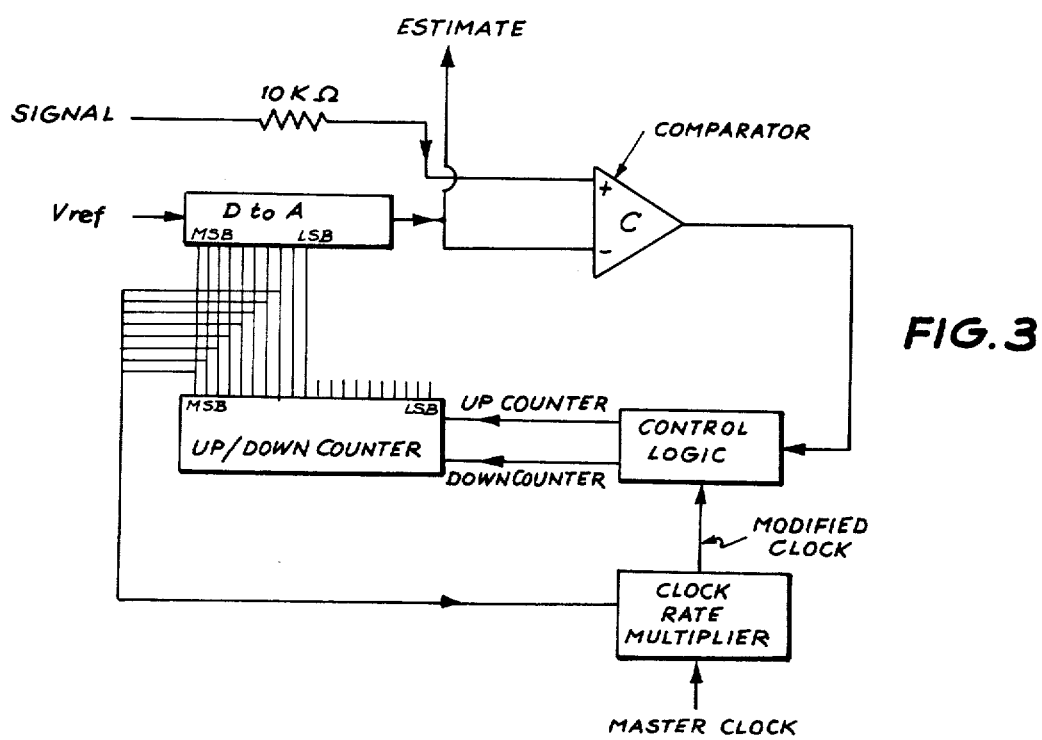
FIG. 3 is a block diagram of an embodiment of a digital-logarithmic recursive percentile estimator of the present invention.

FIG. 3 shows a logarithmic recursive percentile estimator (log RPE) which is the same as the lin RPE, except that the basic clock rate is proportional to the amplitude of the estimate. In this arrangement, the estimator behaves to the incoming signal as if it had been log converted. The response time therefore becomes independent of amplitude. Multiplication of the clock rate is achieved in a clock rate multiplier 6 by generating an eight bit pseudo random number of sequence length $2^9-1$ and comparing the eight most significant bits of the reversible counter with this number. Whenever the value of the generator of the clock rate multiplier, which is changed at the master clock rate, is greater than the value of the reversible counter, the basic clock to the control logic circuit 5 is gated off. Consequently, the average clock rate is directly proportional to the estimate. A switch is provided which enables the user to select either the lin RPE or log RPE modes. The logic control circuit may, for example, be transistor-transistor logic (TTL), or otherwise, as desired.

The apparatus of the invention may be readily made portable. The apparatus of the invention is suitable for use as a monitor of noise pollution in measuring noise level percentiles designated $L_n$, where L is the dBA level exceeding n% of the time. Typical percentiles measured are $L_{10}$, $L_{50}$ and $L_{90}$. The output estimate of the apparatus can be recorded on a printer or chart recorder.

The lin RPE is suitable for use with a sound meter having a logarithmic-analogue output while the log RPE is suitable for use with sound level meters having a linear output.

The invention is by no means restricted to the aforementioned details which are described only as examples; they may vary within the framework of the invention, as defined in the following claims.

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

I claim:

1. A recursive percentile estimator, comprising
   a comparator for comparing a time varying signal quantity and a time varying estimate signal corresponding to a predetermined percentile, said comparator having an output, a first input to which said signal quantity is supplied and a second input to which said estimate signal is supplied;
   an integrator having a first input connected to the output of said comparator, a second input and an output connected to the second input of said comparator, said integrator providing said estimate signal at its output; and
   probability means connected to the second input of said integrator for providing a signal corresponding to a cumulative probability equivalent to said predetermined percentile.

2. A recursive percentile estimator as claimed in claim 1, wherein the first input of said comparator is the positive input thereof and the second input of said comparator is the negative input thereof, the first input of said integrator is the noninverting input thereof and the second input of said integrator is the inverting input thereof.

3. A method of utilizing a recursive percentile estimator to determine a sound level percentile, comprising the steps of
   continuously measuring a time varying sound level during a predetermined time period;
   applying an analogue signal of said sound level to a recursive percentile estimator, and
   recording the percentile estimate value provided by said estimator.

4. The method of determining a sound level percentile as claimed in claim 3, wherein the analogue signal is compared with a time varying estimate signal corresponding to a predetermined percentile in the recursive percentile estimator, the comparison result is integrated with a signal corresponding to a cumulative probability equivalent to said predetermined percentile in said recursive percentile estimator, and the integration result is said percentile estimate value and is resupplied to said recursive percentile estimator for recomparison until the comparison result indicates a comparison.

5. A recursive percentile estimator, comprising
   a comparator for comparing a time varying signal quantity and a time varying estimate signal corresponding to a predetermined percentile, said comparator having an output, a first input to shich said signal quantity is supplied and a second input to which said estimate signal is supplied;
   an integrator having a first input connected to the output of said comparator, a second input and an output connected to the second input of said comparator, said integrator providing said estimate signal at its output, said integrator comprising a reversible counter having inputs and outputs and a digital to analogue converter having inputs connected to the outputs of said counter and an output connected to said comparator; and probability means connected to the second input of said integrator for providing a signal corresponding to a cumulative probability equivalent to said predetermined percentile, said probability means comprising a control logic circuit including a mark to space generator, said control logic circuit having outputs connected to the inputs of said counter and an input, and clock means connected to the input of said control logic circuit for providing clock pulses.

6. A recursive estimator as claimed in claim 5, wherein the clock pulse rate is proportional to the amplitude of the estimate signal.

* * * * *